(12) United States Patent
Sharif

(10) Patent No.: US 11,675,416 B2
(45) Date of Patent: Jun. 13, 2023

(54) CROSS-DOMAIN POWER CONTROL CIRCUIT

(71) Applicant: Apple Inc., Cupertino, CA (US)

(72) Inventor: Shah M. Sharif, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/659,566

(22) Filed: Apr. 18, 2022

(65) Prior Publication Data

US 2022/0317762 A1 Oct. 6, 2022

Related U.S. Application Data

(63) Continuation of application No. 16/522,418, filed on Jul. 25, 2019, now Pat. No. 11,307,644.

(51) Int. Cl.
*G06F 1/3293* (2019.01)
*G06F 1/3287* (2019.01)
*G11C 5/14* (2006.01)

(52) U.S. Cl.
CPC .......... *G06F 1/3293* (2013.01); *G06F 1/3287* (2013.01); *G11C 5/147* (2013.01)

(58) Field of Classification Search
CPC combination set(s) only.
See application file for complete search history.

(56) References Cited

U.S. PATENT DOCUMENTS

| | | | |
|---|---|---|---|
| 6,831,481 B1 * | 12/2004 | Nguyen | H03K 19/17736 326/85 |
| 8,456,217 B2 | 6/2013 | Goldstein et al. | |
| 9,977,480 B2 | 5/2018 | Kolla et al. | |
| 10,234,883 B1 | 3/2019 | Du et al. | |
| 2003/0112041 A1 | 6/2003 | Clark et al. | |
| 2004/0041597 A1 | 3/2004 | Yang et al. | |
| 2008/0074171 A1 | 3/2008 | Bhattacharya et al. | |

(Continued)

FOREIGN PATENT DOCUMENTS

CN 103853225 A 6/2014

OTHER PUBLICATIONS

International Search Report and Written Opinion in PCT Appl. No PCT/US2020/041610 dated Oct. 20, 2020, 19 pages.

(Continued)

*Primary Examiner* — Jaweed A Abbaszadeh
*Assistant Examiner* — Brian J Corcoran
(74) *Attorney, Agent, or Firm* — Kowert, Hood, Munyon, Rankin & Goetzel, P.C.; Erik A. Heter; Dean M. Munyon

(57) ABSTRACT

A cross-domain power control circuit is disclosed. The circuit includes a first circuit branch having a first transistor coupled to a first supply voltage node and a second circuit branch having a second transistor coupled to the first supply voltage node. A third circuit branch is coupled between a second supply voltage node and a third supply voltage node. A second supply voltage conveyed on the second supply voltage node is less than a first supply voltage conveyed on the first supply voltage node. A fourth circuit branch is coupled between the first and third supply voltage nodes. In a first mode of operation, control circuitry causes the second supply voltage to be conveyed to the third supply voltage node. In a second mode of operation, the control circuitry causes the first supply voltage to be conveyed to the third supply voltage node.

20 Claims, 6 Drawing Sheets

(56) References Cited

U.S. PATENT DOCUMENTS

| | | |
|---|---|---|
| 2009/0259864 A1 | 10/2009 | Li et al. |
| 2009/0315399 A1 | 12/2009 | Shikata |
| 2010/0231044 A1* | 9/2010 | Tatsumi ................ G06F 1/3287 |
| | | 307/39 |
| 2011/0095737 A1 | 4/2011 | Chu et al. |
| 2013/0339761 A1* | 12/2013 | Abhishek .............. G06F 1/3287 |
| | | 713/300 |
| 2018/0174643 A1* | 6/2018 | Cheng ................. H01L 23/5286 |
| 2020/0350817 A1* | 11/2020 | De ........................ H02M 3/155 |

OTHER PUBLICATIONS

Notice of Allowance in Chinese Appl. No. 202080053164.4 dated Apr. 20, 2023, 6 pages.

* cited by examiner

CROSS-DOMAIN POWER CONTROL CIRCUIT

PRIORITY CLAIM

The present application is a continuation of U.S. application Ser. No. 16/522,418, entitled "Cross-Domain Power Control Circuit," filed Jul. 25, 2019 (now U.S. Pat. No. 11,307,644); the disclosure of which is incorporated by reference herein in its entirety.

BACKGROUND

Technical Field

This disclosure is directed to electronic circuits, and more particularly, for circuits used to control an interface between power domains operating at different supply voltages.

Description of the Related Art

Modern integrated circuits (ICs) often times have multiple power domains with circuitry powered by different supply voltages. For example, an IC may have a first power domain having circuitry powered by a first supply voltage, and a second power domain having circuitry powered by a second supply voltage that is different from the first. This may be due in part to the fact that some circuits operate better with certain voltages than other. Thus, an IC having both analog and digital circuits implemented thereon may use a first supply voltage for the analog circuitry and a second supply voltage for the digital circuits.

Although various circuits may be implemented in different power domains, it is often times necessary for circuits in these different domains to communicate with one another. Furthermore, to achieve power savings, many ICs are implemented such that idle circuits can be powered down. This may at times involve powering down circuitry within one power domain, while circuitry in an adjacent power domain may remain powered on for continuing operations.

SUMMARY

A cross-domain power control circuit is disclosed. In one embodiment, the circuit includes a first circuit branch having a first transistor coupled to a first supply voltage node and a second circuit branch having a second transistor coupled to the first supply voltage node. A third circuit branch is coupled between a second supply voltage node and a third supply voltage node. A second supply voltage conveyed on the second supply voltage node is less than a first supply voltage conveyed on the first supply voltage node. A fourth circuit branch is coupled between the first and third supply voltage nodes. In a first mode of operation, control circuitry causes the second supply voltage to be conveyed to the third supply voltage node. In a second mode of operation, the control circuitry causes the first supply voltage to be conveyed to the third supply voltage node.

The third supply voltage node may receive the second supply voltage when the first supply voltage is powered down, which corresponds to operation in the first mode. When the first supply is fully powered on, the first supply voltage is provided to the third voltage node. A third mode of operation may occur when the first supply voltage is initially powered on, as the third supply voltage node ramps up from the second supply voltage to the first supply voltage. A fourth mode of operation may occur when the first supply voltage node when the first supply voltage is to be powered down, as the third supply voltage node ramps down from the first supply voltage to the second supply voltage.

BRIEF DESCRIPTION OF THE DRAWINGS

The following detailed description makes reference to the accompanying drawings, which are now briefly described.

Figure 1:
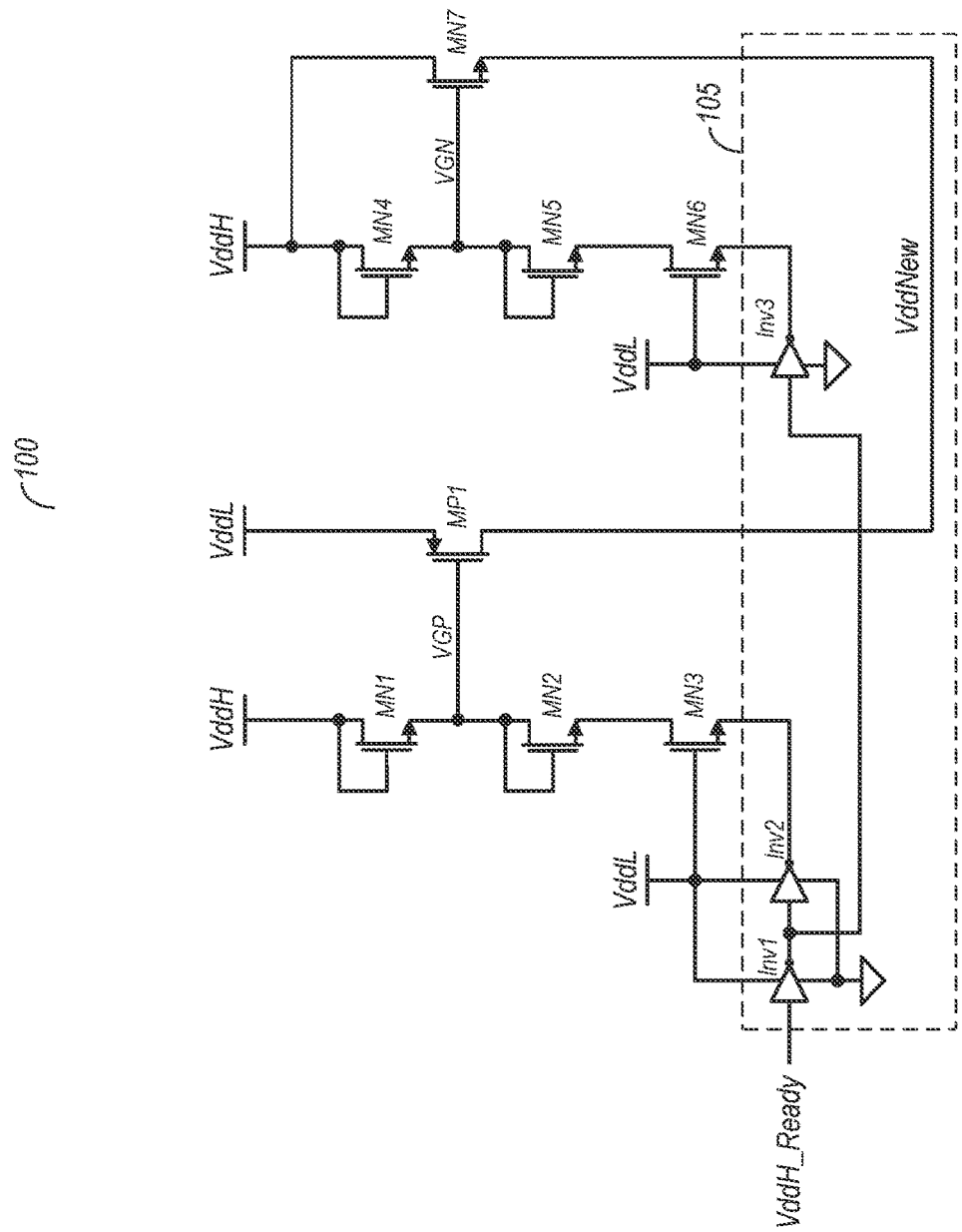
FIG. 1 is a schematic diagram of one embodiment of a cross-domain power control circuit.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something; physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is directed to a cross-domain power control circuit. Continuous supply voltage scaling in modern CMOS processes can pose a challenge for sensitive analog circuits in an analog power domain. Since analog performance may have certain requirements regarding linearity, bandwidth, lower switch-on resistance, and so on, analog supply voltages may be regulated and boosted. In some integrated circuits, a digital power supply may produce a higher analog power supply using a voltage regulator (e.g., a boost regulator). While this arrangement may have some benefits, a problem may occur when the analog subsystem needs to be operational on an 'as needed' basis, but is otherwise powered down when not needed. In certain applications, such as an on-chip measurement system, an analog subsystem (in an analog power domain) is connected to a digital subsystem by a front end transmission gate switch network. When the analog subsystem is in a power down mode (and thus the analog power supply is powered down), the front end transmission gate switch network cannot be turned off. As a result, multiple interface signals crossing from the digital power domain to the analog power domain are fed through to the analog domain. When these signals are effectively shorted by the transmission gate switch network, severe performance degradation or failure can occur during operation of the digital subsystem. Additionally, the digital signals can forward bias source bulk diodes of the PMOS devices used in the transmission gate switch network. This can cause excessive current to be drawn by the digital subsystem, which can be another source of performance failure.

The cross-domain power control circuit of the present disclosure may address these problems. In particular, signal feedthrough and digital signal shorting problems may be eliminated, while the front end switch network is not forward biased in any mode of operation.

In various embodiments, the cross-domain power control circuit is coupled to first and second supply voltage nodes associated with first and second power domains, respectively. The cross-domain power circuit also includes a third supply voltage node which can be set to either a first supply voltage (from the first supply voltage node) or the second supply voltage (from the second supply voltage node). For example, the first supply voltage may be an analog supply voltage for an analog power domain, while the second supply voltage may be a supply voltage for digital circuitry in the second power domain. The analog supply voltage may, in various embodiment, be greater than the second supply voltage provided to the digital circuitry in the second (digital) power domain. When the first supply voltage is powered down, the second supply voltage may be provided to the third supply voltage node. When the first supply voltage is initially powered on, the cross-domain power control circuit may begin ramping up the voltage on the third supply voltage node. When the analog supply voltage is fully powered on and ready, the cross-domain power control circuit may then electrically couple the first supply voltage to the third supply voltage node. Digital logic within the first power domain may then be used to control switches of a switching network for the transfer of signals between the digital and analog power domains.

When the analog power domain is to be powered down, the circuit disclosed herein may operate to ramp down the voltage on the third supply voltage node from the analog supply voltage to the second (digital) supply voltage. When the analog supply voltage has been fully powered down, the third supply voltage node may receive the second supply voltage.

Turning now to FIG. 1, a schematic diagram of one embodiment of a cross-domain power control circuit is illustrated. In the embodiment shown, power controller 100 includes a first circuit branch (including MN1, MN2, and MN3, which are NMOS devices) and a second circuit branch (including MN4, MN5, and MN6, also NMOS devices) that are each coupled to receive a first supply voltage VddH. In some embodiments, VddH may be an analog supply voltage, e.g., used to supply analog circuitry. For example, the analog circuitry may implement an on-chip measurement system used to measure various operating parameters of an integrated circuit. The circuit of FIG. 1 also includes a third circuit branch (including MP1, a PMOS device) coupled to receive a second supply voltage, VddL. A fourth circuit branch (including MN7, another NMOS device) is coupled to receive the first supply voltage. In one embodiment, the supply voltage VddL may be less than VddH, and may be used to supply digital circuitry in a second power domain.

The third and fourth circuit branches of power controller 100 are each coupled to a third supply voltage node, VddNew. In the third circuit branch, transistor MP1 is coupled between VddL and VddNew. In the fourth circuit branch, MN7 is coupled between VddH and VddNew. These transistors may be implemented as devices having very low threshold voltages. Accordingly, when MN7 is active (and MP1 is inactive), the voltage present on VddNew may be substantially equal to that of VddH, with a small (if not negligible) difference accounted for by the threshold voltage of MN7. When MP1 is active (and MN7 is inactive, VddNew may be substantially equal to VddL.

Power controller 100 in the embodiment shown also includes control circuitry 105, which includes inverters Inv1, Inv2, and Inv3. Inverter Inv1 includes an input which may receive the control signal VddH_Ready, which may be provided from a power management circuit (discussed below). Depending on the state of VddH_Ready (asserted or de-asserted), one of MP1 or MN7 may be activated.

A first mode of operation may occur when VddH_Ready is asserted while VddH is powered up. If VddH_Ready is high (corresponding to an asserted state in this embodiment) and VddH is powered up, the output of inverter Inv1 is low, while the output of Inv2 and Inv3 are high. When the output of Inv3 is high, MN6 is held inactive, since its source voltage is approximately the same as its gate voltage (VddL) in this case. Thus, the gate-source voltage across MN6 is insufficient for activation. Since there is no active pull-down path through this circuit branch when MN6 is inactive, MN4, which is diode-coupled in this embodiment, pulls VGN high (to within a threshold voltage of VddH and thereafter by the subthreshold current VGN is raised to very close to the level of VddH), thus activating MN7. As shown in the drawing, VGN is the voltage present on the gate terminal of MN7, and is also tied to the source of MN4 and gate/drain terminals of diode-coupled MN5. As previously noted, MN7 may be implemented with a low threshold voltage. The activation of MN7 thus causes VddNew to be pulled up to a voltage that is substantially that of VddH, the only difference being the small threshold voltage. Meanwhile, the high output from Inv2 causes MN3 to be held inactive, since this case results in the gate and source voltages of this device being substantially equal and thus the gate-source voltage is insufficient for activation. Accordingly, the circuit branch of MN3 provides no pull-down path. Transistor MN1, diode-coupled in this case, thus pulls VGP high, thereby preventing the activation of PMOS device MP1 (VGP being the voltage on the gate terminal of MP1, and also coupled to the source terminal of MN1 and the gate/drain terminals of diode-coupled MN2). Accordingly, VddL is isolated from VddNew in this mode of operation.

Another mode of operation occurs when VddH is powered down and VddH_Ready is de-asserted (low in this embodiment). When VddH_Ready is low, the output of Inv1 is high, while the outputs of Inv2 and Inv3 are low. When Inv2 is low, MN3 is activated as the gate-source voltage across this device exceeds the threshold in this case. This in turn activates a pull-down path in this circuit branch, through MN2, MN3, and Inv2. As a result, VGP is pulled low, causing activation of MP1. When MP1 is active, the supply voltage VddL is conveyed to VddNew. Meanwhile, the low output from Inv3 causes MN6 to be active. With MN6 active, there is a pull-down path through its corresponding circuit branch. Thus, VGN is also pulled low, inhibiting activation of MN7. VddH is thus isolated form VddNew in this mode of operation.

In addition to the modes described above, power controller 100 may operate in two additional modes, a ramp-up mode (which includes a transition of VddH from powered down to powered up) and a ramp-down mode (which includes a transition of VddH from powered up to powered down). These modes will be discussed in further detail below with reference to the timing diagram of FIG. 4.

Figure 2:
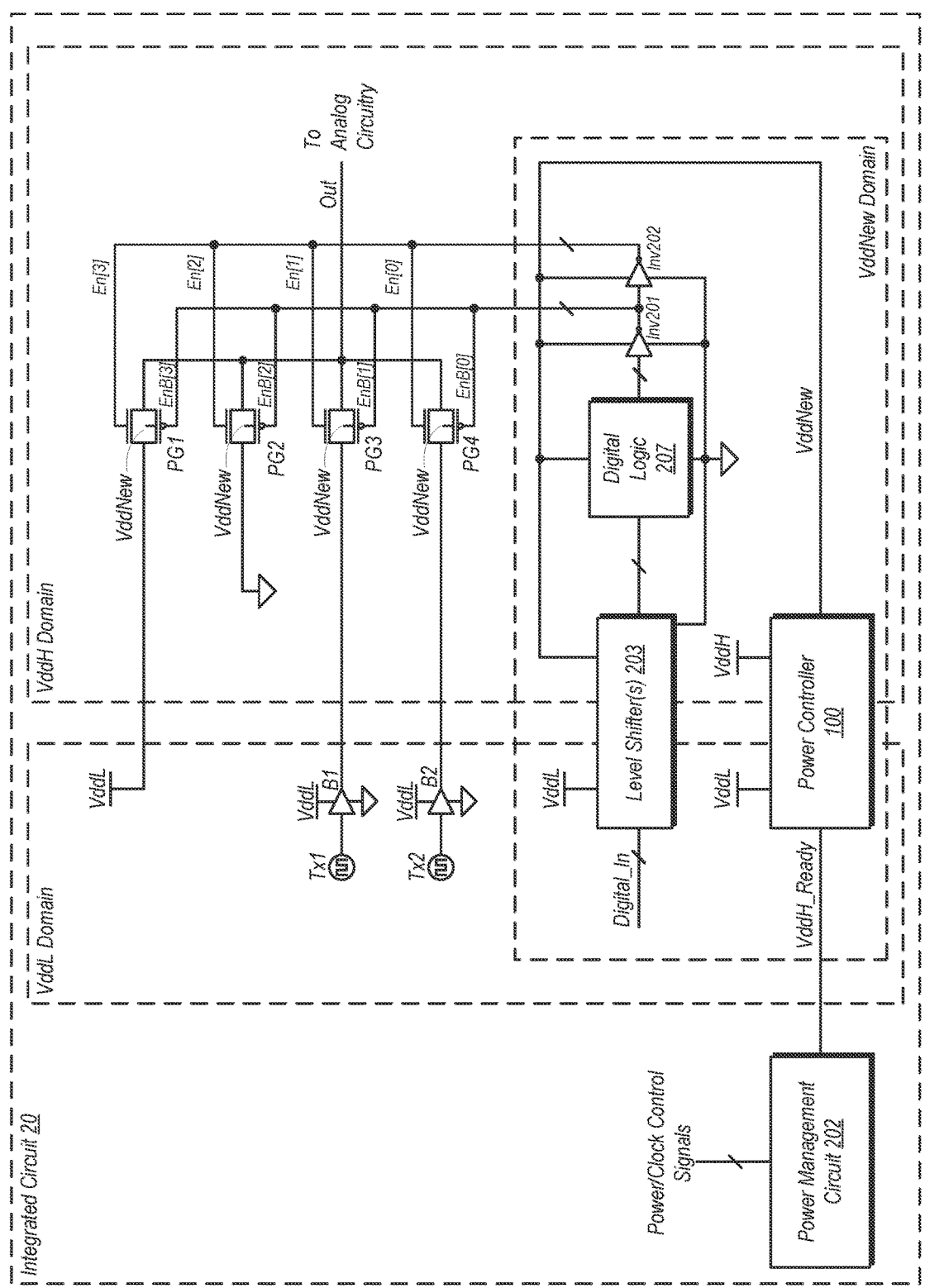
FIG. 2 is a schematic diagram illustrating an arrangement of a cross-domain power control circuit in the context of two power domains.

FIG. 2 is a schematic diagram illustrating an arrangement of a cross-domain power control circuit in the context of two power domains. In the embodiment shown, integrated circuit 20 includes two power domains, VddL Domain and VddH Domain. Although not explicitly shown here, the VddL Domain may include various digital circuits, some of which may transfer signals to the VddH Domain. Similarly, while not explicitly shown here, the VddH Domain may include various analog circuits that may receive some signal input from digital circuitry in the VddL Domain.

As shown here, a switch network of passgates (PG1, PG2, PG3, and PG4) is implemented in the VddH Domain. Power controller 100 in the embodiment shown is implemented across the power domains and provides voltage VddNew into the VddNew domain. Absent power controller 100, the problems described above may occur when VddH is powered down, as certain devices used to implement the passgates (e.g., the PMOS devices) may not be able to be fully turned off. In particular the signals crossing the power domains into the switch network may be effectively shorted to the analog domain by passgates PG1-PG4, as the passgates are turned on in the absence of the analog power supply when power controller 100 is absent. Generating VddNew using power controller 100 and using the digital logic 207 in the VddNew Domain may enable each device of the passgates to be fully turned off such that these problems do not occur.

It is noted that the various signals shown as provided to passgates PG1-PG4 (VddL, ground, Tx1 via way of buffer B1, and Tx2 by way of buffer B2) are provided as examples, and do not necessarily represent the actual types of signals that are passed between the VddL and the VddH domains.

Integrated circuit 20 includes one or more level shifters 203, which are coupled to receive one or more corresponding digital input signals ('Digital In'). Level shifters 203 may, when VddNew is substantially equal to VddH, perform a level shifting operation for signals input from the VddL domain to the VddNew domain. Otherwise, when VddNew is substantially equal to VddL, signals may be conveyed through level shifters 203 with the same levels on the outputs as at the inputs.

Digital logic 207 may receive the digital signals from level shifters 203. Among the functions of digital logic 207 is to output one or more signals to generate enable signals (En[0]-En[3]) and their complements (Enb[0]-Enb[3]) by inverters Inv201 and Inv202. When VddNew is substantially equal to VddL, digital logic 207 generates signals levels such that the correspondingly generate enable signals may fully shut down the devices that implement passgates PG1-PG4. This may in turn prevent the occurrence of those problems outlined above.

In the embodiment shown, IC 20 in the embodiment shown includes power management circuit 202. Among the functions of power management circuit is to control the powering up and powering down of the supply to VddH, which is discussed in further detail below. Additionally, power management circuit 202 also generates the VddH_Ready signal provided to power controller 100. When VddH is powered on, power management circuit 202 may assert the VddH_Ready signal once VddH is fully powered on and stable. Similarly, power management circuit 202 may de-assert the VddH_Ready signal during the power down of VddH. The assertion and de-assertion of VddH_Ready causes changes to the state of power controller 100 as discussed above in reference to FIG. 1.

Figure 3:
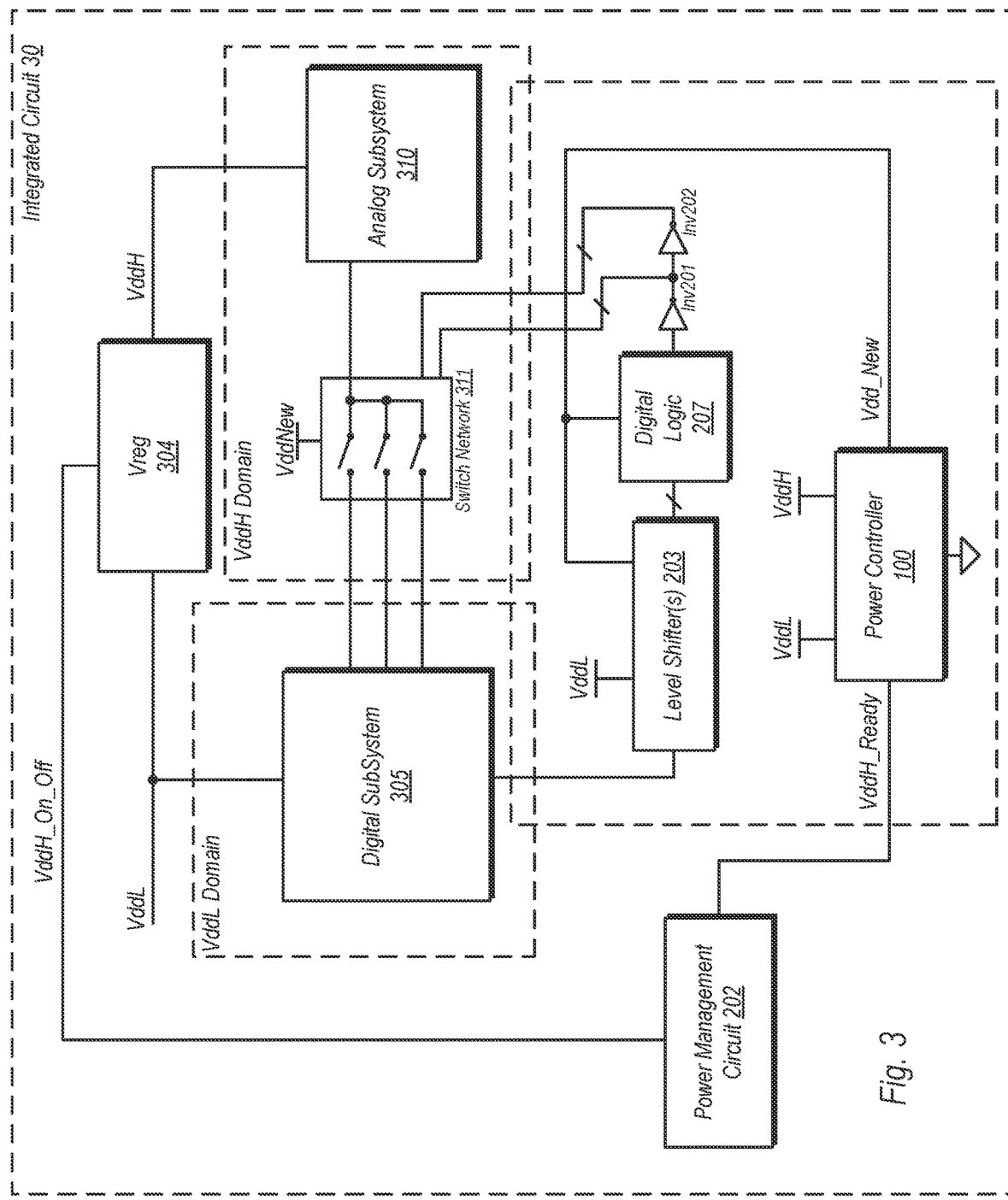
FIG. 3 is a block diagram illustrating first and second power domains and circuitry coupling the two.

FIG. 3 is a block diagram illustrating first and second power domains and circuitry coupling the two. In the embodiment shown, integrated circuit 30 includes a number of the same elements as integrated circuit 20 of FIG. 2, including a power management circuit 202, level shifters 203, digital logic 207, inverters Inv201 and Inv203, and power controller 100. Integrated circuit 30 in the embodiment shown also includes a switch network 311, which may be implemented in a manner similar to that of the passgates shown in FIG. 2. A digital subsystem 305 is implemented in the VddL domain, and may include a number of different digital circuits that perform various functions carried out by integrated circuit 30. An analog subsystem 310 is implemented in the VddH domain, and may include various types of analog circuitry.

In the embodiment shown, integrated circuit 30 also includes a voltage regulator 304. Since VddH is greater than VddL in this embodiment, voltage regulator 304 is a boost voltage regulator.

Power management circuit 202 in the embodiment shown may control the status of VddH (powered up or powered down) through the signal VddH_On_Off provided to voltage regulator 304. When VddH_On_Off is asserted, VddH may be powered up, while VddH may be powered down when VddH_On_Off is de-asserted. Power management circuit 202 in the embodiment shown assert and de-assert the VddH_Ready signal in conjunction of assertion/de-assertion of the VddH_On_Off signal in controlling the various modes of power controller 100.

Figure 4:
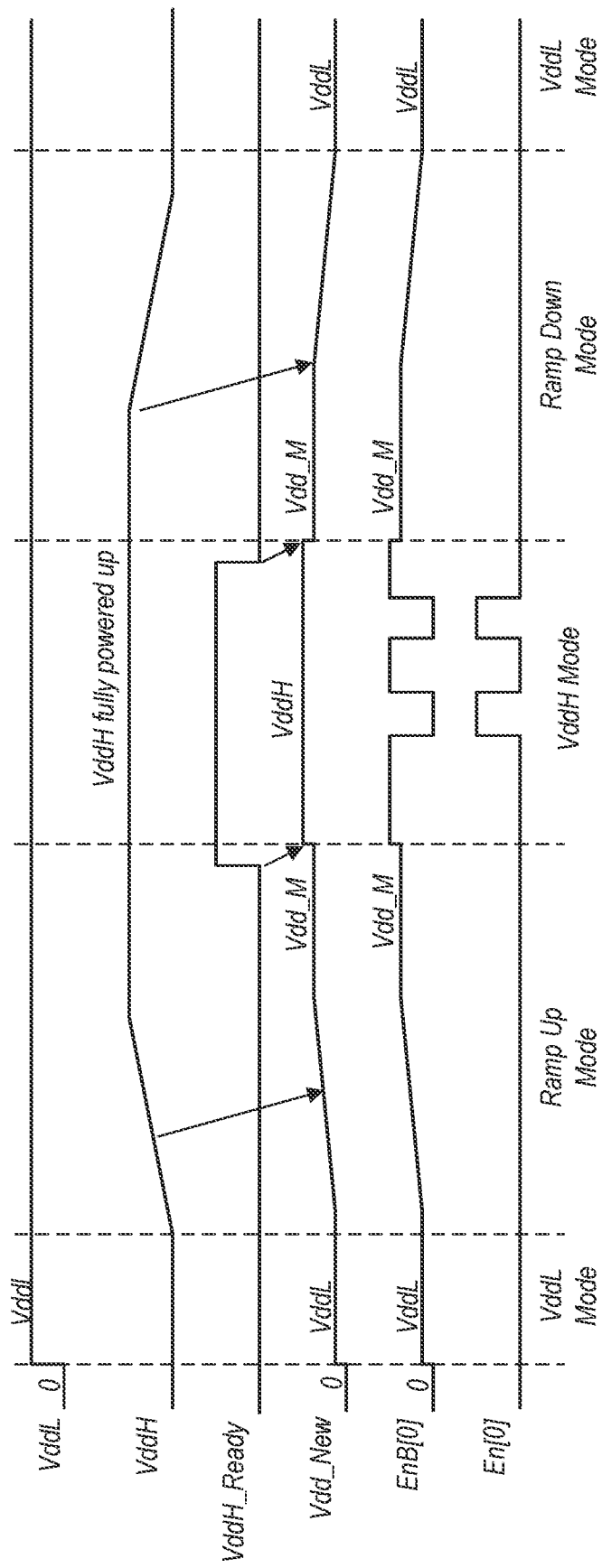
FIG. 4 is a timing diagram illustrating various modes of operation of one embodiment of a cross-domain power control circuit.

FIG. 4 is a timing diagram illustrating various modes of operation of one embodiment of a cross-domain power control circuit. More particularly, the timing diagram of FIG. 4 illustrates four different modes of operation for various embodiments of power controller 100 as discussed above.

In the illustrated example, power controller 100 operates in the VddL mode when VddL is powered on while VddH is powered down. It is also noted that in the VddL mode, the Enb signals (EnB[0] is shown here) are held at the substantially the same level as VddL, while the En signals (En[0] is shown here) is held substantially to zero volts. In embodiments utilizing passgates, such as that shown in FIG. 2, this holds the passgates in an off state, as the EnB signals at VddL cause the PMOS device in each passgate to be off, while the low En signals hold the NMOS device in each passgate as off. Additionally, in the VddL mode, the voltage of VddNew is substantially the same as VddL.

In the Ramp Up mode, VddH is turned on and begins powering up. Responsive to the ramping up of VddH, VddNew also ramps up, initially to an intermediate voltage, Vdd_M. This intermediate voltage is greater than VddL but less than VddH. In the Ramp Up mode, VGN is determined by the voltage division of the diodes formed by the coupling of MN4 and MN5. VddNew is very close to VGN (within one threshold of VGN). The EnB signals also ramp up to Vdd_M. At the end of the Ramp Up mode, when VddH is fully powered up and stable, the VddH_Ready signal is asserted, causing entry into the VddH mode.

Responsive to assertion of the VddH_Ready signal, Vdd-New transitions to a voltage that is substantially the same as VddH. Similarly, the EnB signals initially transition to this voltage. Thereafter, the En and EnB signals may be toggled as desired to enable or disable various switches of a switch network through which signals can be transferred between the VddH and VddL domains.

Exit from the VddH mode and into the Ramp Down mode occurs responsive to de-assertion of the VddH_Ready signal. This de-assertion occurs prior to commencing the power down of VddH. Upon initially de-asserting VddH_ready, VddNew falls back to the intermediate voltage Vdd_M. VddH may then begin the power down, as this voltage is ramped down. As a result of the ramping down of VddH, Vdd_New also ramps down from Vdd_M, eventually reaching VddL. Similarly, the EnB signals also ramp down in concert with VddNew. Upon VddNew reaching VddL, the power controller returns to the VddL mode.

Figure 5:
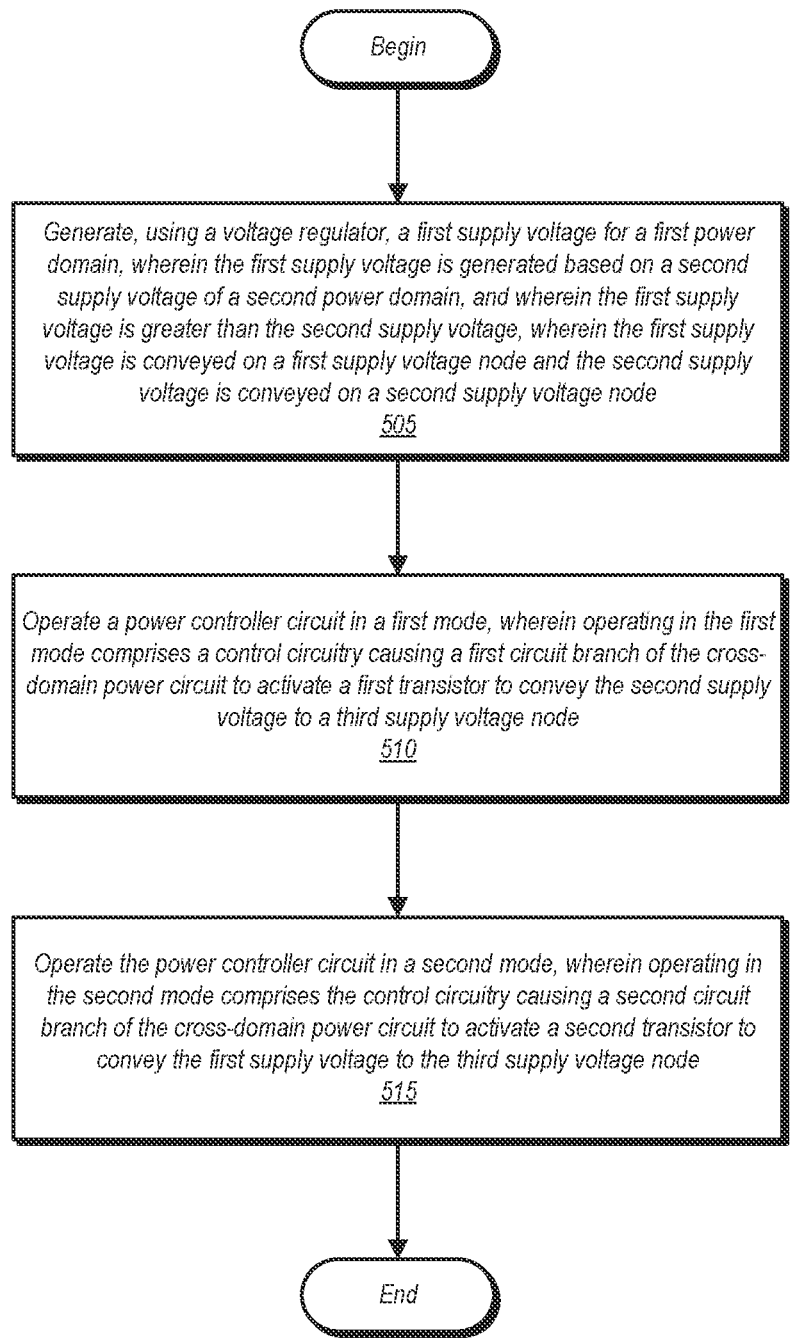
FIG. 5 is a flow diagram illustrating one embodiment of a method for operating a cross-domain power control circuit.

FIG. 5 is a flow diagram illustrating one embodiment of a method for operating a cross-domain power control circuit. Method 500 as shown here may be performed by various embodiments of the circuitry/hardware discussed above. Additionally, hardware/circuit embodiments not explicitly disclosed herein may also be capable of performing method 500, and may thus fall within the scope of this disclosure.

Method 500 begins with generating, using a voltage regulator, a first supply voltage for a first power domain, wherein the first supply voltage is generated based on a second supply voltage of a second power domain, and wherein the first supply voltage is greater than the second supply voltage, wherein the first supply voltage is conveyed on a first supply voltage node and the second supply voltage is conveyed on a second supply voltage node (block 505). The method further includes operating a power controller circuit in a first mode, wherein operating in the first mode comprises a control circuitry causing a first circuit branch of the cross-domain power circuit to activate a first transistor to convey the second supply voltage to a third supply voltage node (block 510). Operating the power controller circuit in a second mode comprises the control circuitry causing a second circuit branch of the cross-domain power circuit to activate a second transistor to convey the first supply voltage to the third supply voltage node (block 515).

In some embodiments, the method includes operating the power controller circuit in a third mode. Operating the power controller circuit in the third mode in such embodiments includes causing the voltage regulator to power up the first supply voltage node to the first supply voltage using a power management circuit. Operating in the third mode also includes asserting a control signal provided from the power management circuit to the control circuitry. Thereafter, operation in the third mode includes deactivating the first transistor responsive to asserting the control signal, wherein deactivating the first transistor causes discontinuation of providing the second supply voltage to the third supply voltage node, and activating the second transistor responsive to asserting the control signal. Operation in the third mode also includes causing the first supply voltage to be provided to the third supply voltage node responsive to activating the second transistor.

Various embodiments also include operating the power controller circuit in a fourth mode. Operating the power controller circuit in the fourth mode comprises de-asserting the control signal and deactivating the second transistor responsive to de-asserting the control signal. Operating in the fourth mode also includes activating the first transistor responsive to asserting the control signal and causing the second supply voltage to be provided on the third supply voltage node responsive to activating the first transistor.

Figure 6:
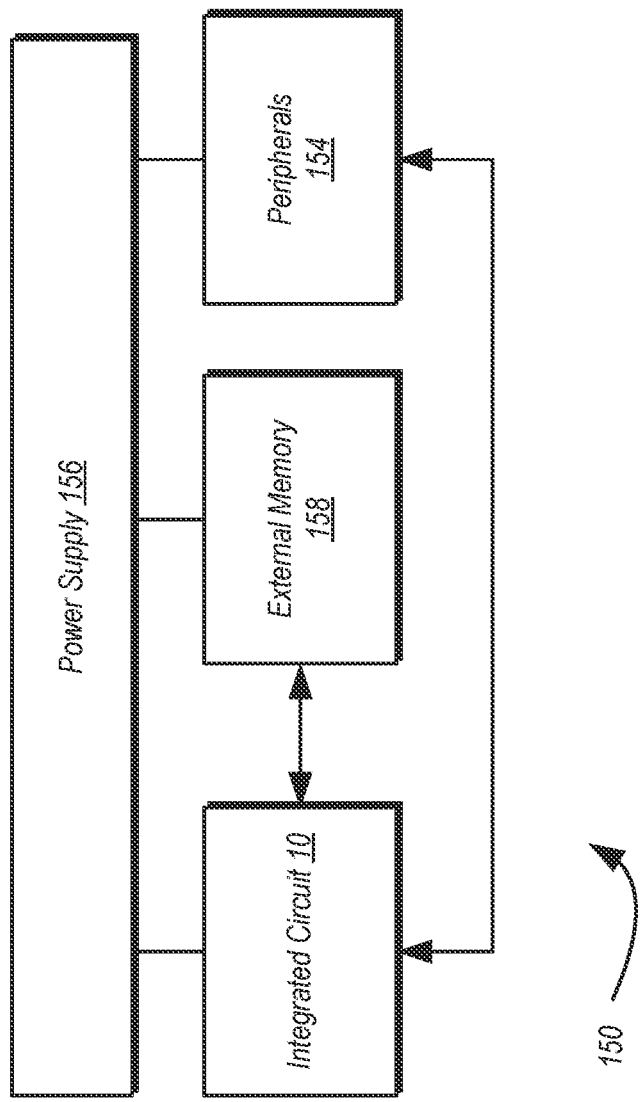
FIG. 6 is a block diagram of one embodiment of an example system.

Turning next to FIG. 6, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

In various embodiment of system 150, integrated circuit 10, or other integrated circuits implemented within various ones of peripherals 154 may include multiple power domains (e.g., similar to IC 20 of FIG. 2 and/or IC 30 of FIG. 3). Thus, such embodiments may also include various embodiments of a cross-domain power controller and other circuits discussed above.

Numerous variations and modifications will become apparent to those skilled in the art once the above disclosure is fully appreciated. It is intended that the following claims be interpreted to embrace all such variations and modifications.

What is claimed is:

1. An apparatus comprising:
a cross-domain power control circuit coupled to a first supply voltage node in a first voltage domain and a second supply voltage node in a second voltage domain, wherein the cross-domain power control circuit includes:
a first circuit coupled to receive a first supply voltage from the first supply voltage node, wherein the first circuit is configured to generate a first control signal;
a second circuit coupled to receive the first supply voltage and configured to generate a second control signal;
a third circuit coupled to receive a second supply voltage from the second supply voltage node, wherein the third circuit is configured to convey the second supply voltage to a third supply voltage node in response to the first circuit activating the first control signal;
a fourth circuit coupled between the first supply voltage node and the third supply voltage node, wherein the fourth circuit is configured to convey the first supply voltage to the third supply voltage node in response to the second circuit activating the second control signal; and
a control circuit configured to, during operation in a first mode, cause the second circuit to activate the second control signal and cause the first circuit to deactivate the first control signal, and further configured to, during operation in a second mode, cause the first circuit to activate the first control signal and cause the second circuit to deactivate the second control signal;
wherein the first circuit includes a pull-up circuit configured to deactivate the first control signal and a pull-down circuit configured to activate the first control signal, wherein the pull-up circuit comprises a first transistor coupled between the first supply voltage node and a first control signal node, and wherein the pull-down circuit comprises a second transistor and a third transistor coupled in series between the first control signal node and the control circuit, wherein the first and second transistors are diode-coupled.

2. The apparatus of claim 1, wherein the second circuit includes a second pull-up circuit configured to activate the second control signal and a second pull-down circuit configured to deactivate the second control signal.

3. The apparatus of claim 2, wherein the second pull-up circuit comprises a fourth transistor coupled between the first supply voltage node and a second control signal node, and wherein the second pull-down circuit comprises a fifth transistor and a third transistor coupled in series between the second control signal node and the control circuit, wherein the first and second transistors are diode-coupled.

4. The apparatus of claim 1, wherein the first circuit is configured to activate the first control signal in response to a power management circuit activating a third control signal provided to the control circuit, and wherein the second circuit is configured to activate the second control signal in response to the power management circuit deactivating the third control signal.

5. The apparatus of claim 1, wherein the cross-domain power control circuit is configured to operate in a third mode in response to a power management circuit causing the first supply voltage node to transition from a power down state to a power up state, wherein during operation in the third mode, the third supply voltage node is configured to transition from the second supply voltage to an intermediate voltage.

6. The apparatus of claim 5, wherein the cross-domain power control circuit is further configured to operate in a fourth mode in response to the control circuit deactivating a third control signal, wherein during operation in the fourth mode, the third supply voltage node is configured to transition from the first supply voltage to the intermediate voltage, and subsequently transition from the intermediate voltage to the second supply voltage responsive to powering down the first supply voltage node.

7. The apparatus of claim 1, further comprising a boost converter configured to generate the first supply voltage using the second supply voltage.

8. The apparatus of claim 1, further comprising an analog subsystem implemented in the first voltage domain and a digital subsystem implemented in the second voltage domain, wherein the digital subsystem is configured to convey one or more signals to the analog subsystem via a switch network.

9. The apparatus of claim 1, wherein the control circuit is configured to, during operation in a third mode, ramp up the third supply voltage node to an intermediate supply voltage concurrent with ramping up the first supply voltage.

10. The apparatus of claim 9, wherein the control circuit is configured to, during operation in a fourth mode, set the third supply voltage node to the intermediate supply voltage and subsequently ramp down the third supply voltage node to the second supply voltage concurrent with ramping down the first supply voltage.

11. A method comprising:
generating, in a first voltage domain and using a boost converter, a first supply voltage based on a second supply voltage provided from a second voltage domain;
activating, using a first circuit during operation in a first mode, a first control signal in response to a control circuit receiving a ready signal and the first supply voltage being provided to the first domain,
wherein activating the first control signal comprises a pull up portion of the first circuit pulling a voltage of the first control signal toward the first supply voltage;
inhibiting activation of a second control signal by a second circuit during operation in the first mode;
providing, using a third circuit, the first supply voltage to a third supply voltage node in response to the first circuit activating the first control signal;
deactivating the first control signal, by the first circuit, wherein deactivating the first control signal comprises a pull-down portion of the first circuit pulling the voltage of the first control signal toward a ground voltage;
activating the second control signal, by the second circuit, in response to the control circuit no longer receiving the ready signal and the first voltage no longer being provided to the first domain; and
providing, using a fourth circuit, the second supply voltage to the third supply voltage node in response to the second circuit activating the second control signal.

12. The method of claim 11, further comprising setting the third supply voltage node to an intermediate voltage during a ramp up of the first supply voltage, wherein the intermediate voltage is greater than the second supply voltage and less than a full value of the first supply voltage, wherein ramping up of the first supply voltage is performed prior to activating the ready signal.

13. The method of claim 12, further comprising setting the third supply voltage node to the intermediate voltage and subsequently ramping down to the second supply voltage in response to deactivation of the first control signal and activation of the second control signal, wherein deactivation of the first control signal and activation of the second control signal is performed in response to a deactivation of the ready signal.

14. The method of claim 11, further comprising providing one or more digital signals from a digital subsystem in the second voltage domain to an analog subsystem in the first voltage domain when the boost converter is providing the first supply voltage.

15. The method of claim 11, wherein activating the first control signal comprises the control circuit causing the first circuit to pull the first control signal to a logic low value.

16. The method of claim 11, wherein activating the second control signal comprises the control circuit causing the second circuit to pull the second control signal to a logic high value.

17. A system comprising:
an analog subsystem in a first voltage domain, the analog subsystem configured to operate using a first supply voltage provided via a first supply voltage node;
a digital subsystem in a second voltage domain, the digital subsystem configured to operate using a second supply voltage provided via a second supply voltage node;
a boost converter configured to generate the first supply voltage using the second supply voltage; and
a power control circuit configured to provide the first supply voltage to a third supply voltage node during operation in a first mode and further configured to provide the second supply voltage to the third supply voltage node during operation in a second mode;
wherein, during operation in a third mode, the power control circuit is configured to ramp up the third supply voltage node to an intermediate supply voltage concurrent with ramping up the first supply voltage; and
wherein, during operation in a fourth mode, the power control circuit is configured to set the third supply voltage node to the intermediate supply voltage and subsequently ramp down the third supply voltage node to the second supply voltage concurrent with ramping down the first supply voltage.

18. The system of claim 17, wherein the power control circuit includes a first circuit configured to activate a first control signal as a logic low value during operation in the first mode, and further includes a second circuit configured to activate a second control signal as a logic high value during operation in the second mode.

19. The system of claim 18, further comprising:
a third circuit configured to provide the first supply voltage to the third supply voltage node in response to the first circuit activating the first control signal; and
a fourth circuit configured to provide the second supply voltage to the third supply voltage node in response to the second circuit activating the second control signal.

20. The system of claim 17, further comprising a power management circuit configured to assert and de-assert a ready signal provided to the power control circuit and further configured to activate and deactivate the boost converter.

\* \* \* \* \*